(12) United States Patent
Chromczak (10) Patent No.: US 8,710,889 B1
(45) Date of Patent: Apr. 29, 2014

(54) APPARATUS FOR CONTROLLABLE DELAY CELL AND ASSOCIATED METHODS

(75) Inventor: Jeffrey Christopher Chromczak, Brownsville (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/888,369

(22) Filed: Sep. 22, 2010

(51) Int. Cl.
*H03H 11/26* (2006.01)

(52) U.S. Cl.
USPC .......................................... 327/261; 327/264

(58) Field of Classification Search
None
See application file for complete search history.

(56) References Cited

U.S. PATENT DOCUMENTS

| | | | | |
|---|---|---|---|---|
| 4,560,963 A * | 12/1985 | Sharpe | ........................ | 333/172 |
| 5,467,038 A * | 11/1995 | Motley et al. | ................. | 327/185 |
| 5,532,718 A * | 7/1996 | Ishimaru | ...................... | 345/211 |
| 5,905,393 A * | 5/1999 | Rinderknecht et al. | ....... | 327/202 |
| 6,181,185 B1 * | 1/2001 | Shepston | .................... | 327/295 |
| 6,211,713 B1 * | 4/2001 | Uhlmann | ..................... | 327/211 |
| 6,310,500 B1 * | 10/2001 | Varma | ........................ | 327/211 |
| 6,385,106 B2 * | 5/2002 | Choi | ............................. | 365/203 |
| 6,434,062 B2 * | 8/2002 | Lee | ................................ | 365/194 |
| 6,781,861 B2 * | 8/2004 | Gomm et al. | ................. | 365/144 |
| 6,850,103 B2 * | 2/2005 | Ikeno et al. | .................. | 327/202 |
| 6,940,307 B1 * | 9/2005 | Liu et al. | ........................ | 326/38 |
| 7,405,603 B2 * | 7/2008 | Ku | ................................. | 327/158 |
| 7,633,323 B2 * | 12/2009 | Lee | ............................... | 327/158 |
| 2005/0264518 A1 * | 12/2005 | Nojiri et al. | .................. | 345/103 |

OTHER PUBLICATIONS

A Low-Noise, 900-MHz VCO in 0.6um CMOS, 34 IEEE Journal of Solid-State Circuits 586-91 (May 1999).
An On-Chip Calibration Technique for Reducing Supply Voltage Sensitivity in Ring Oscillators, 42 IEEE Journal of Solid-State Circuits 775-83 (Apr. 2007).

* cited by examiner

*Primary Examiner* — An Luu
(74) *Attorney, Agent, or Firm* — Law Offices of Maximilian R. Peterson (57) ABSTRACT

A delay cell includes a feed-forward inverter and a feedback inverter. The feedback inverter is coupled to the feed-forward inverter. The feed-forward inverter has an input and an output. Similarly, the feedback inverter has an input and an output. A drive strength of the feed-forward inverter is larger than a drive strength of the feedback inverter such that a transition at the input of the feed-forward inverter propagates to the output of the feed-forward inverter.

18 Claims, 8 Drawing Sheets

APPARATUS FOR CONTROLLABLE DELAY CELL AND ASSOCIATED METHODS

TECHNICAL FIELD

The disclosed concepts relate generally to electronic apparatus and, more particularly, to apparatus for delay cells, systems or apparatus using such delay cells, and associated methods.

BACKGROUND

Electronic circuits often use various apparatus for timing signals. For example, electronic circuits or systems may use one or more clock signals. The specifications for the circuit or system often prescribe the timing of clock signals with respect to other signals, or the timing of various signals with respect to one another.

Delay cells provide one mechanism to align signals and coordinate the timing of events. By delaying one or more signals, one may align those signals with other signals, and thus coordinate various events.

SUMMARY

The disclosed concepts provide mechanisms for controllable, configurable, or programmable delay cells. In one exemplary embodiment, a delay cell includes a feed-forward inverter and a feedback inverter. Each of the feed-forward and feedback inverters has a respective input and output. The feedback inverter is coupled to the feed-forward inverter. The drive strength of the feed-forward inverter is larger than the drive strength of the feedback inverter such that a transition at the input of the feed-forward inverter propagates to the output of the feed-forward inverter.

In another exemplary embodiment, a delay chain circuit includes a plurality of delay cells coupled in a cascade configuration. Each delay cell has a feed-forward path and a feedback path. The drive strength of the feed-forward path is larger than the drive strength of the feedback path such that a transition at the input of the respective delay cell propagates to the output of the delay cell.

In yet another exemplary embodiment, a method of delaying a signal by a desired delay value includes feeding the signal to an input of a feed-forward path to generate an output signal, and feeding back the output signal through a feedback path to the input of the feed-forward path. The drive strengths of the feed-forward and feedback paths are adjusted such that the delay has a desired sensitivity to a quantity.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate to delay cells, and more specifically, to controllable delay cells. Delay cells according to the disclosed concepts may be used in variety of electronic circuitry and/or systems, as desired.

More specifically, delay cells according to the disclosed concepts provide controllable delay sensitivity to voltage or current variations, such as power-supply voltage variations. This capability allows the configuring or controlling of the delay provided by the delay cells as a function of, or in response to, variations of the voltage or current, such as the supply voltage.

Furthermore, delay cells according to another aspect of the disclosed concepts provide the capability to keep the delay of the delay cell constant or relatively or substantially constant (e.g., within a given percentage, for example, 1%, 3%, 5%, etc.). In some embodiments, the delays cells or delay cell elements provide improved immunity to power supply voltage variations, ripple, or noise.

Figure 1:
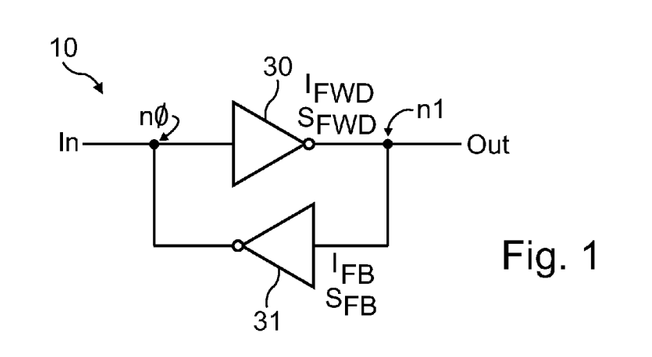
FIG. 1 illustrates a delay cell according to an exemplary embodiment.

FIG. 1 illustrates a delay cell according to an exemplary embodiment. Delay cell 10 includes inverters 30 and 31. Inverters 30 and 31 are arranged in a feedback configuration. In other words, the output of inverter 30 drives the input of inverter 31, and vice-versa.

More specifically, node "n0" denotes the input of inverter 30, and node "n1" denotes its output. Conversely, nodes "n0" and "n1" denote, respectively, the output and input of inverter 31.

Each of inverters 30 and 31 is characterized by two design parameters: drive strength, I, and delay sensitivity, s. Drive strength, I, determines the output current of the inverter during a switching event. Delay of delay cell 10 is inversely proportional to drive strength. Sensitivity, s, is defined as change in the delay of delay cell 10 for a given or certain change in power supply voltage.

In some embodiments, the drive strength of feedforward inverter 30, $I_{FWD}$, is larger or substantially larger than the drive strength of feedback inverter 31, $I_{FB}$. In some embodiments, the drive strength of feedforward inverter 30, $I_{FWD}$, is much larger than the drive strength of feedback inverter 31, $I_{FB}$. This property facilitates the propagation of changes in the input signal n0 to the output of inverter 30, and also causes delay cell 10 to behave logically like a single inverter.

The sensitivities of the feedforward and feedback inverters 30 and 31, respectively, are selected such that the overall sensitivity of cell delay 10 to supply voltage has a desired, prescribed, or specified value. For example, to implement a delay cell with supply-independent delay (or relatively or substantially supply-independent delay) the sensitivity of feedback inverter 31 is set so as to offset or substantially or completely offset the intrinsic sensitivity of feedforward inverter 30.

Figure 2:
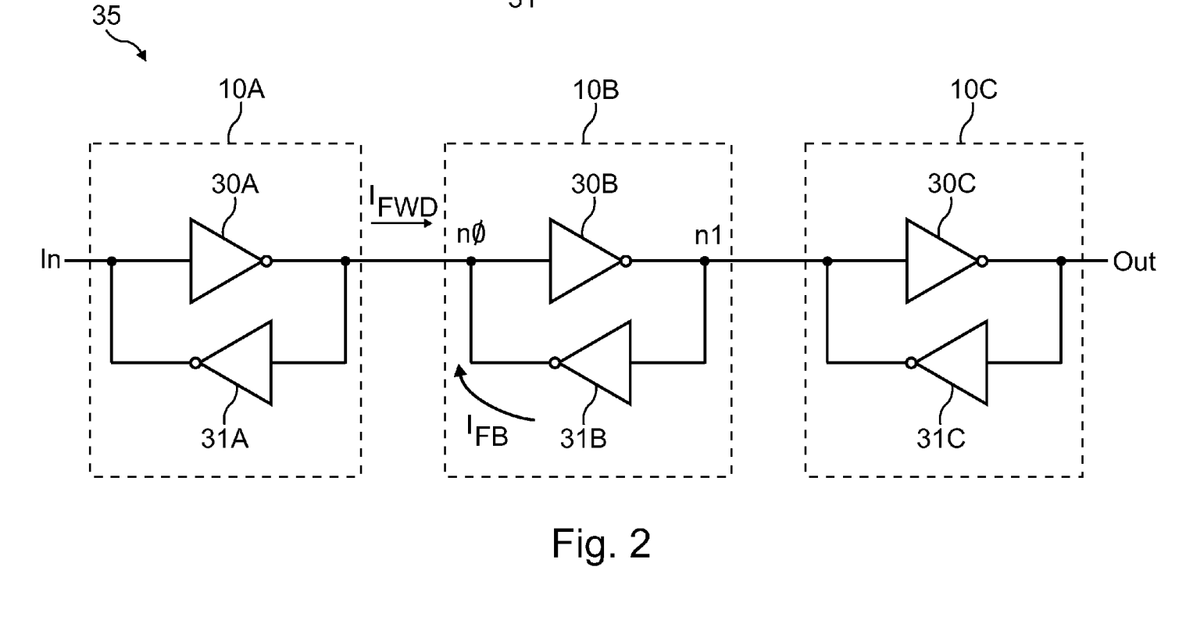
FIG. 2 depicts a chain of delay cells according to an exemplary embodiment.

One may use two or more delay cells 10, coupled in tandem, as desired. FIG. 2 depicts a chain of delay cells 35 according to an exemplary embodiment.

In the example shown, chain of delay cells 35 includes three delay cells denoted as 10A-10C. As persons of ordinary skill in the art who have the benefit of the description of the disclosed concepts understand, however, one may use fewer (two) or more delay cells, as desired.

Using a plurality of delay cells in tandem has the capability of providing a desired amount of delay. For example, in the circuit shown in FIG. 2, chain of delay cells 35 provides a delay of 3T, where T denotes the delay through each of delay cells 10A-10C. (Note that in other examples, two or more of the delay cells may have delays that are different from one another.)

Suppose that initially the input signal (denoted as "In") of chain of delay cells 35 is at logic high, and therefore node n0 is at logic low. Consequently, node n1 has a logic high value, and the output signal (denoted as "Out") of chain of delay cells 35 has a logic low value.

Now, suppose that a transition occurs in chain of delay cells 35. For purposes of this exemplary description of transition events, suppose that, in the example shown in FIG. 2, delay cells 10A-10C have the same structure and, therefore, the same delay.

Consider the transitions of nodes n0 and n1, i.e., the input and output of delay cell 10B. When an input transition (i.e., a transition of "In" from high to low) occurs, the output driver (inverter 30A) of delay cell 10A attempts to pull up node n0 to the logic high level.

Because node n1 is still at the logic high level, feedback inverter 31B continues to drive node n0 low. For the transition (or for transitions, generally) to propagate through the chain of delay cells 35, the inverters in delay cells 10A-10C should be configured such that $I_{FWD} \gg I_{FB}$.

In such a case, the forward path inverter (inverter 30A) will eventually pull node n0 above the switching threshold of forward-path inverter 30B in delay cell 10B. This event causes a contention at node n1, as the transition propagates. The transition eventually propagates to node n1. The transition at node n1 turns off the feedback pull-down transistor in inverter 31B.

Logically (i.e., considered from a Boolean logic perspective), each delay cell behaves similar to an ordinary digital logic inverter well known to persons of ordinary skill in the art. During the transition event, however, the pull-up current of the forward path inverter (inverter 30A in delay cell 10A) is partially offset by the output current of the feedback inverter (inverter 31B in delay cell 10B). Note that the above description pertains to a falling input transition (high to low). A similar set of events takes place during a rising input transition (pull-up current in the feed-forward path being partially offset by the pull-down current in the feedback inverter), as persons of ordinary skill in the art who have the benefit of the description of the disclosed concepts understand.

Delay through each of delay cells 10A-10C is determined by the net effect of the forward path current and the feedback current, denoted, respectively, as $I_{FWD}$ and $I_{FB}$. Sensitivities of the forward and feedback path inverters (e.g., inverters 30B and 31B, respectively, of delay cell 10B) can be selected or configured so the total switching current for one or more of delay cells 10A-10C has a desired sensitivity to supply voltage.

Consider, for example, delay cell 10B. Specifically, consider the case where forward path inverter 30B has higher or much higher nominal drive strength than does feedback inverter 31C (to cause transitions to propagate through chain of delay cells 35). Suppose further that feedback inverter 31C has higher or much higher sensitivity than forward path inverter 30B. As noted, the feed-forward inverter(s) is/are in contention with the feedback inverter(s) of the succeeding cell (e.g., inverter 30B contending with inverter 31C).

In this scenario, the drive strength variation of feedback inverter 31C can nearly, substantially, or completely offset variations in the forward path drive strength in the presence of supply voltage fluctuations. Consequently, the delay of delay cell 10B is nearly, substantially, or completely independent of supply voltage. Put another way, the interaction between inverters 30B and 31C provides controllable delay sensitivity for delay cell 10B and, hence, delay chain 35.

Implementing delay cells that meet $I_{FWD} \gg I_{FB}$ and have controllable overall sensitivity entails independent control of drive strength and sensitivity. Many device options are available for control of drive strength, as persons of ordinary skill in the art who have the benefit of the description of the disclosed concepts understand. With respect to MOS transistors, increasing the width and/or decreasing the length of the gate (i.e., increasing W/L) increases drive strength of the transistor.

Both of those quantities (W and L) are easily designed or implemented at design time. Thus, in some exemplary embodiments, delay cells are designed or implemented with a desired or specified W and/or L in order have a desired or appropriate drive strength.

Figure 3:
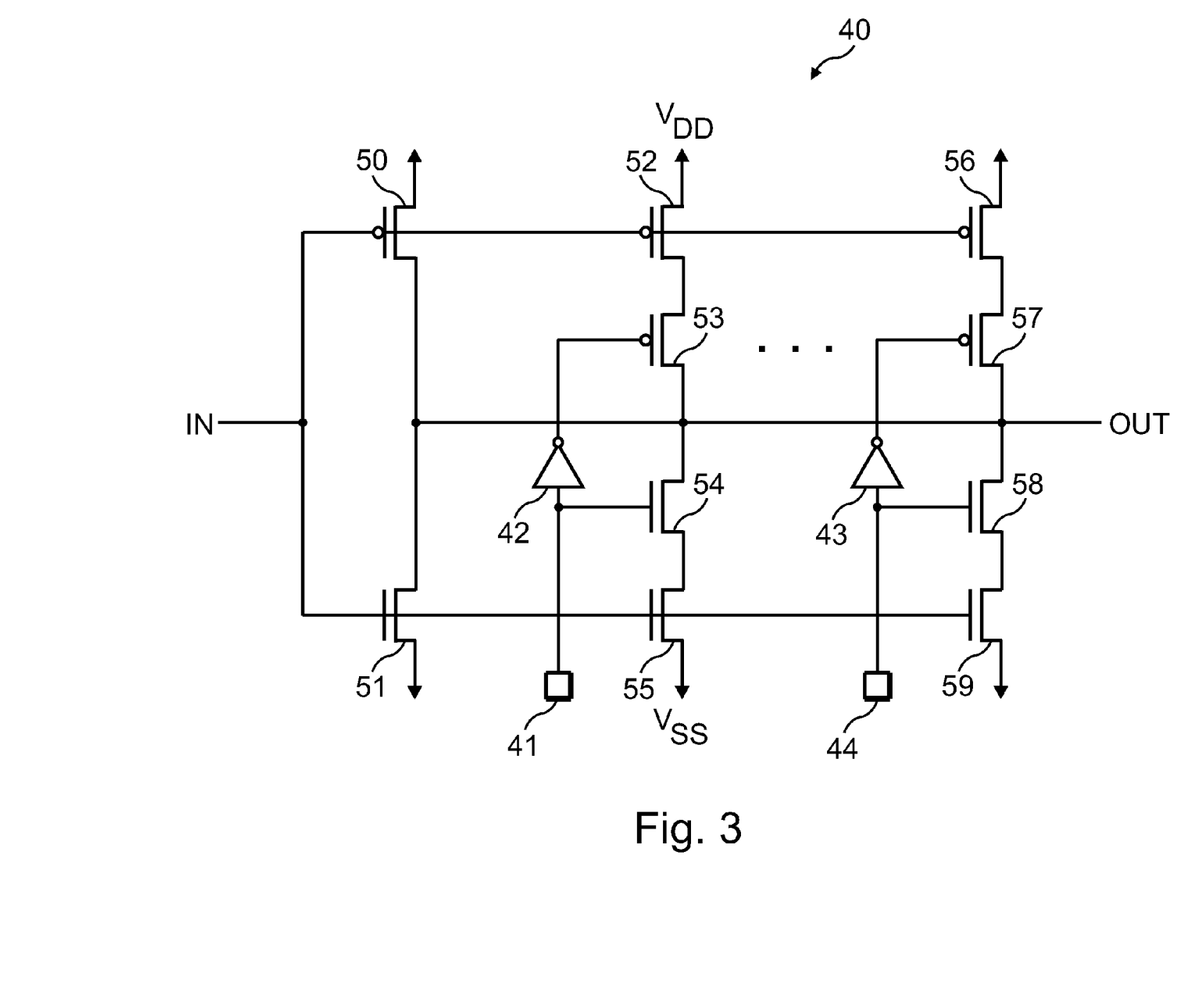
FIG. 3 shows a circuit arrangement for changing drive strength according to an exemplary embodiment.

In some exemplary embodiments, effective length and width of transistors may also be modified after manufacturing or fabrication by changing the arrangement of pull-up or pull-down transistors in inverter 30 and/or inverter 31 (see FIG. 1). FIG. 3 shows a circuit arrangement 40 for changing drive strength according to an exemplary embodiment.

Circuit arrangement 40 shows an inverter (e.g., inverter 30 or inverter 31 in FIG. 1) with configurable or programmable driver strength. Specifically, circuit arrangement 40 illustrates an inverter with tunable or configurable or programmable effective transistor width (W).

Referring to FIG. 3, a typical complementary metal oxide semiconductor (CMOS) logic inverter is implemented with transistors 50 and 51. The inverter has fixed effective width and, therefore, fixed drive strength. Input signal "IN" drives the input of the inverter.

Adjustable effective width inverters may be added in parallel with the conventional inverter to change the overall effective drive strength of circuit arrangement 40. In the exemplary embodiment shown, input signal "IN" drives additional pull-up and pull-down paths. Specifically, input signal "IN" drives the gate of pull-up transistors 52 and 56. Similarly, input signal "IN" drives the gate of pull-down transistors 55 and 59.

Control signals 41 and 44 allow the tuning, configuring, or programming the drive strength of circuit arrangement 40. Digital control signal 41 is used to enable (turn on) gating transistors 54 and 53 (via inverter 42). Likewise, digital control signal 44 is used to enable gating transistors 58 and 57 (via inverter 43).

Thus, digital control signals 41 and 44 allow coupling or isolating the additional pull-up transistors 52 and 56, and pull-down transistors 55 and 59 to or from the output node (labeled as "OUT"). By doing so, one may use digital control signals 41 and 44 to change the effective width of transistors 50 and 51, respectively.

In some embodiments, the sizes (e.g., width) of each of transistors 52-55 may be the same as the sizes of transistors 56-59. Digital control signals 41 and/or 44 may be a thermometer-coded digital value or a binary coded value, as desired.

In some embodiments, the sizes of each path (i.e., pull-up and pull-down transistors) may be different. Digital control signals 41 and/or 44 may be a thermometer-coded digital value or a binary coded value, as desired.

In some embodiments, gating transistors 53, 54, 57 and 58 may be the same type (e.g., positive MOS (PMOS) or negative MOS (NMOS); same gate oxide thickness and/or materials, etc.), respectively, as input transistors 50-51. Furthermore, gating transistors 53, 54, 57 and 58 may be driven from the same supply voltage as the input signal (IN) so that their performance will track that of switching transistors 52, 55, 56, and 59.

In some embodiments, gating transistors 53, 54, 57 and 58 may be a different type, respectively, than input transistors 50-51. Furthermore, gating transistors 53, 54, 57 and 58 may be driven from a different supply voltage as the input signal (IN) that does not have significant or substantial noise (quiet power supply), such as voltage noise. For example, gating transistors 53, 54, 57 and 58 may be thick-oxide transistors that can be driven at a higher gate voltage from a quiet supply such that they contribute negligible series resistance when turned on.

Note that, in exemplary embodiments, one may use a desired number of pull-up and pull-down paths, as desired. The example shown uses two pull-up paths and two pull-down paths, along with corresponding digital control signals 41 and 44. One may use other numbers of pull-up and pull-down paths to realize or implement a desired effective width, as desired, and as persons of ordinary skill in the art who have the benefit of the description of the disclosed concepts understand.

Figure 4:
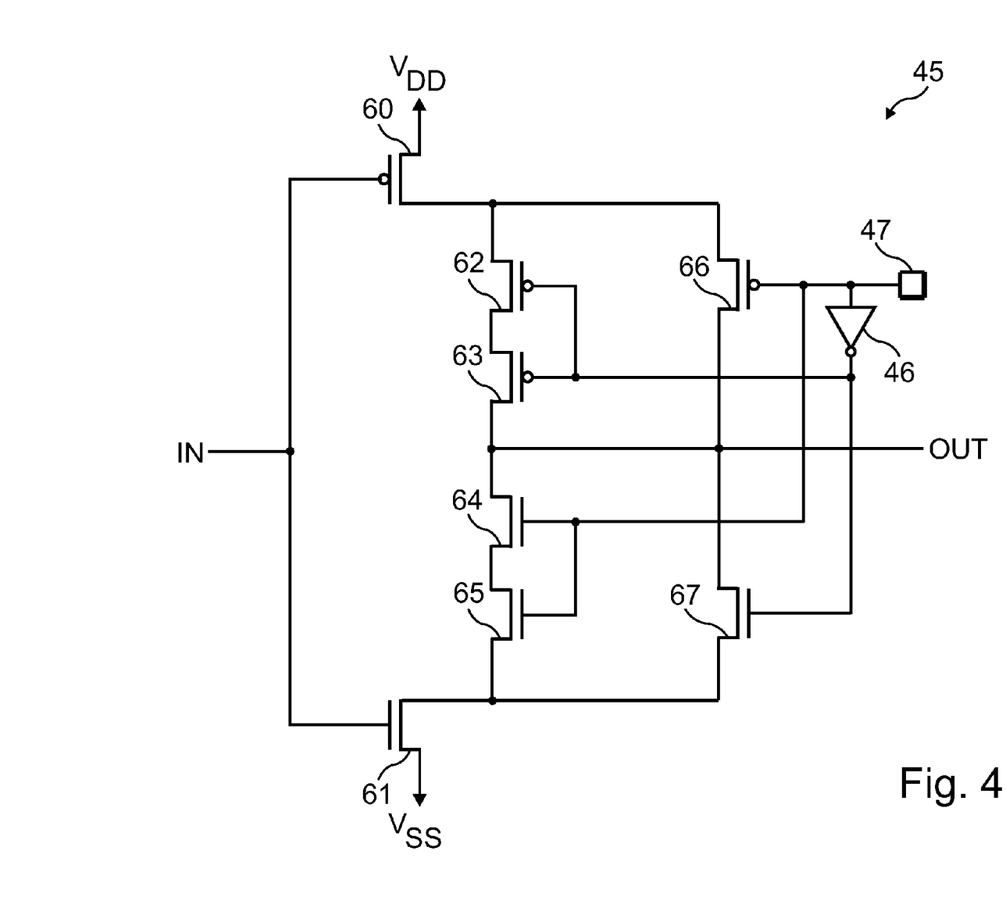
FIG. 4 depicts a circuit arrangement for changing drive strength according to another exemplary embodiment.

FIG. 4 depicts a circuit arrangement 45 for changing drive strength according to another exemplary embodiment. Circuit arrangement 45 includes an inverter with adjustable effective length of transistors. In the absence of the additional transistors (i.e., transistors 62-67), transistors 60-61 would function as a logic inverter. (Note that for circuit arrangement 45 to function as an inverter, one would enable transistors 62-65 or transistors 66-67.) By adding transistors 62-63 and transistors 64-65 to the pull-up and pull-down paths, respectively, one may adjust the drive strength of the circuit.

Referring to circuit arrangement 45, digital control input signal 47 enables one of two paths from the switching input transistors 60-61 to the output node (OUT). Specifically, in one state transistors 62-65 are turned on, and the pull-up and pull-down paths each contain three transistors in series. In other words, in this state, the pull-up and pull-down paths include, respectively, transistors 60, 62, and 63, and transistors 61, 64, and 65.

In the other state, transistors 66 and 67 are turned on by application of a digital control signal 47 having a logic low value. In this scenario, the pull-up and pull-down paths contain two devices in series, and the effective length of the inverter is reduced.

Specifically, the pull-up path includes transistors 60 and 66 (transistors 62-63 are turned off by the logic high signal at the output of inverter 46). The pull-down path includes transistors 61 and 67 (transistors 64-65 are turned off by the logic low level of digital control signal 47).

As persons of ordinary skill in the art understand, semiconductor fabrication processes may have or provide transistors with different gate oxide thicknesses. Thinner oxide devices will have higher drive strength, and vice-versa.

Furthermore, higher channel mobility increases drive strength. Layout and/or semiconductor fabrication processing techniques and options may be available to control mobility in the semiconductor regions or layers, and hence drive strength.

Selective applications of strain techniques like stress memorization layers or silicon germanium (SiGe) source/drain implants may be used to create devices with varying channel mobility. In layout, controlling the proximity of the channel to shallow-trench isolation (STI) oxides can also affect strain and channel mobility.

Similar to drive strength, in exemplary embodiments, sensitivity may also be configured, adjusted, or programmed, as desired. In some embodiments, sensitivity can be adjusted by modifying the threshold voltage of one or more transistors. Increasing the threshold voltage reduces the ($V_{GS}$-$V_T$) term in the drain current equation (i.e., $i_D$=K($V_{GS}$-$V_T$)$^2$, where K is a constant, as persons skilled in the art understand) at nominal supply voltage(s), thus making the drain current more sensitive to voltage changes.

In exemplary embodiments, the threshold voltage can be controlled or adjusted by selecting a different threshold voltage implant for the device. Put another way, the type of implant and its dosage affect the pertinent transistor's threshold voltage, as persons of ordinary skill in the art understand.

In some embodiments, layout and processing techniques may also be used. For example, in highly scaled CMOS processes, well proximity effect (WPE) is known to modify transistor threshold voltages as a function of their proximity to the nearest well edge.

In some embodiments, channel length of a transistor can also be designed to modify or adjust threshold voltage by changing the position and effectiveness of the threshold voltage implant in the channel, and by modifying the relative impact of drain-induced barrier lowering (DIBL) effects.

In some embodiments, the threshold voltages of transistors can be adjusted, configured, or programmed after manufacture. For example, one may adjust, configure or program body bias levels for one or more transistors in order to modify the threshold voltage(s) of the transistor(s).

As noted above and shown, for example, in FIG. 2, multiple instances of a basic delay element or cell according to the disclosed concepts may be coupled together in a cascade configuration to form a delay chain with voltage-insensitive (or substantially or nearly voltage-insensitive) delay. By changing the respective relative strengths and sensitivities of forward and feedback inverters in one or more of the delay cells (e.g., one or more of delay cells 10A-10C in FIG. 2) one can produce delay chains with a range of overall sensitivities. The sensitivity of the delay chain can be greater or less than that of a standard inverter chain, with the same or opposite sign.

As persons of ordinary skill in the art who have the benefit of the description of the disclosed concepts understand, a number of applications exist where varying sensitivity levels are advantageous. As one example, balancing sensitivity of the feedback inverter (e.g., inverter 30 in FIG. 1) to nearly or substantially or completely offset the sensitivity of the feedforward inverter (e.g., inverter 31 in FIG. 1) provides a delay cell with voltage insensitive delay.

This property can be used to match the delay of a circuit that does not experience delay variation (such as a path powered by a supply that does not have significant voltage noise, or a circuit with supply insensitive delay, such as a wire dominated by resistive-capacitive (RC) delay), or to generate a delay that does not vary in the presence of supply noise (e.g., for synthesis of a constant frequency clock, for example). An insensitive delay can also minimize the worst-case delay mismatch between the delay chain and a path powered by a unique, noisy supply with uncorrelated supply noise.

As another example, a delay chain with reduced sensitivity compared to a standard inverter chain can be used to match a path made partially of sensitive and partially of insensitive delay. The relative sensitivity of the chain can be matched to the exact mix of varying and constant delay on the matched path.

As yet another example, a delay chain whose delay varies in the opposite direction of other circuitry in the same circuit or signal path can be used to compensate for delay variations in the other circuitry. For instance, a delay chain may be placed in series with one or more uncompensated (i.e., not compensated for supply voltage sensitivity, etc.) logic stages. In the presence of supply variation, the delay of the uncompensated logic gates will vary. The sensitivity of the delay chain can be set to offset this variation so that the sum of the two delays remains nearly or substantially or completely constant or varies with some other target sensitivity.

Delay cells according to exemplary embodiments may be used in adaptive systems that actively monitor and adjusts the relative strength or sensitivity of feedback and or feed-forward inverters to achieve a certain overall delay sensitivity. Such techniques can be used to compensate for changes in device properties due to temperature fluctuations, aging, and/or other factors.

Adaptive techniques can monitor the relative strength and or sensitivity of replica versions of the feed-forward and/or feedback inverters and adjust them to compensate for variation. Any of the post-manufacturing techniques described above can be applied to control drive strength and/or sensitivity.

In exemplary embodiments, adaptive adjusting, configuring, programming or tuning of drive strength and/or sensitivity can be applied continuously, periodically, or even once during the lifetime of a device, as desired. For example, in some embodiments, during production testing, a fuse setting can be programmed into the device to set the relative strength and/or sensitivity of the feedback and/or feed-forward inverters (e.g., inverters 30 and 31, respectively, in FIG. 1).

This scheme can optimize the overall delay sensitivity of a delay cell (e.g., delay cell 10 in FIG. 1) and/or a delay chain (e.g., delay chain including delay cells 10A-10C in FIG. 2) in the presence of manufacturing variations. Examples of manufacturing variations include, without limitation, semiconductor fabrication process variations, die-to-die variations, IC to IC variations, etc.

In some embodiments, more frequent monitoring and adjustment of drive strength and/or sensitivity can be used to compensate for relatively slowly varying phenomena, such as aging and related effects (e.g., negative bias temperature instability (NBTI) in PMOS devices, positive bias temperature instability (PBTI), drift, etc.). In some embodiments, more frequent or continuous monitoring and adjustment of drive strength and/or sensitivity can compensate for faster varying effects, such as temperature or temperature-dependent variations (e.g., changes in resistor values or mobilities in response to temperature variations).

Figure 5:
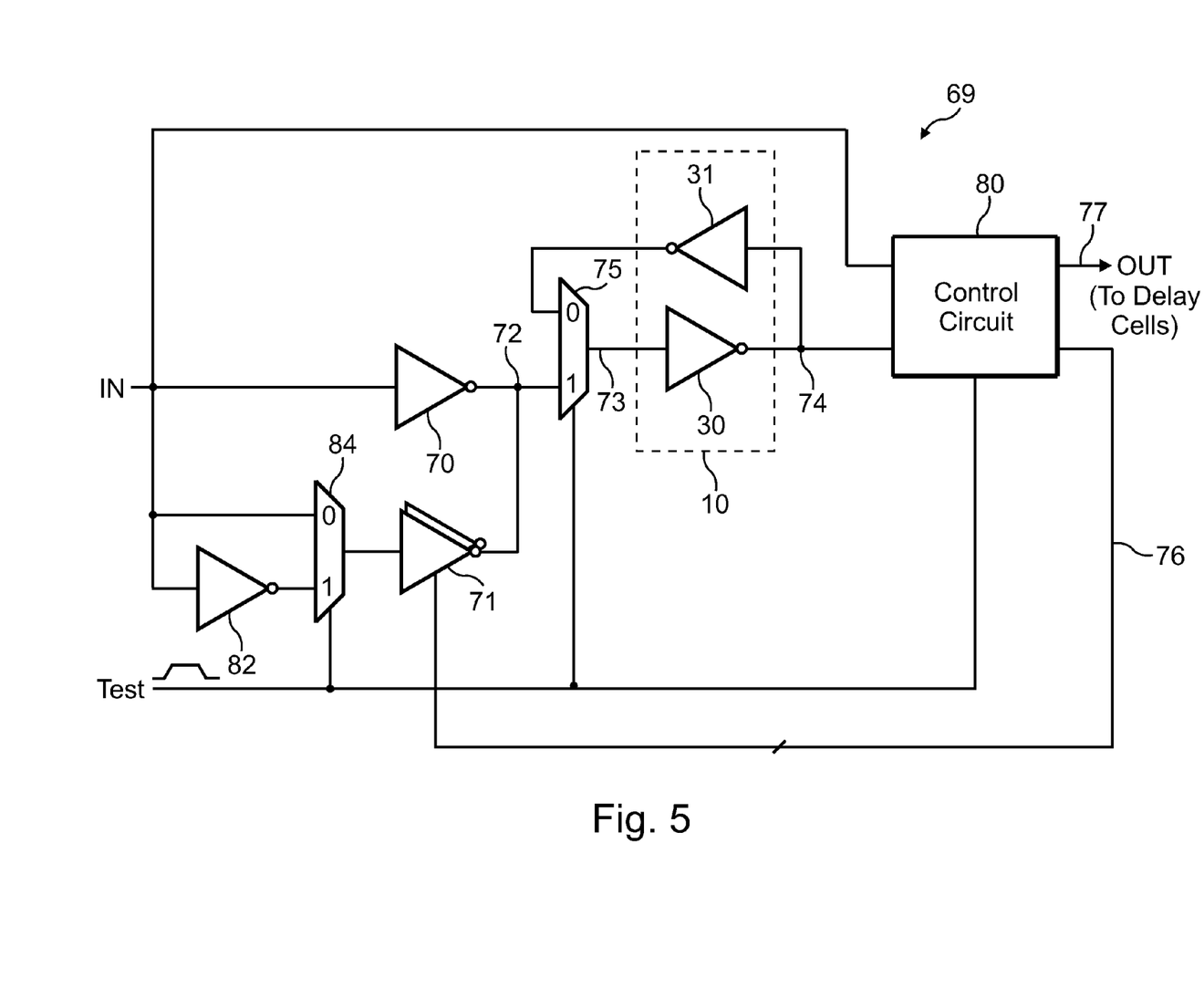
FIG. 5 illustrates a circuit arrangement for adaptive tuning according to an exemplary embodiment.

FIG. 5 illustrates a circuit arrangement 69 for adaptive tuning (or adjustment or configuration or programming) according to an exemplary embodiment. The adaptive tuning circuit may tune drive strength and/or sensitivity of inverters in delay cells (e.g., delay cell 10 in FIG. 1) according to exemplary embodiments.

A digital input signal is applied to the input (IN) of circuit arrangement 69. The input signal (IN) controls whether the circuit is calibrating rising or falling delays. The input is held at either logic high or logic low for one full round of calibration (several periods of the Test signal). For example, to calibrate the contention between the feed-forward pull-up path and the feedback pull-down path, the input signal (IN) is set to logic low. The Test input is pulsed a number of times, as described below in detail).

Control circuit 80 observes the value at node 74 each time the Test input is pulsed, and adjusts control signal 76 accordingly. When the desired contention ratio is achieved, the input signal (IN) is set to logic high, and the process repeats to calibrate the contention between the feed-forward pull-down path and the feedback pull-up path.

A test signal (labeled "Test"), or an enable signal, drives the select input of multiplexer (MUX) 84, the select input of MUX 75, and an input to control circuit 80 (described below in detail). More specifically, a high level at the Test input sets up the contention at node 73 so that control circuit 80 can determine whether inverter 30 interprets the contention voltage as logic high or low.

Consider the situation where the test signal has a logic low value. The low value of the test signal causes MUX 84 to provide the true version of the input signal (IN) to inverter 71. Inverter 71 is a copy or replica of feedback inverter 31, or it may be a scaled replica of feedback inverter 31. Inverter 71 may have programmable drive strength by using, for example, the techniques described above.

Inverters 70 and 71 are related to inverters 30 and 31, respectively, and may or may not be identical to them. For example, in some embodiments, the design target may be to create a desired drive-strength ratio, say, 4:1, between inverters 30 and 31 in one or more delay cells.

Feedback inverter 31 can have programmable drive strength, as described above, and inverter 71 can be made up of four copies of inverter 31, coupled in parallel. Control circuit 80 can adjust the drive strength of inverter(s) 71 until it is equal to that of inverter 70 (which is easier than trying to calibrate a 4:1 ratio).

If the same control signal 76 is then broadcast to the actual delay chains (which use inverter 31 in the feedback path, with one fourth the drive strength of inverter 71), then each delay cell is calibrated to the desired 4:1 ratio. Of course, one may use a number of inverters and a wide range of ratios, as desired, and as persons of ordinary skill in the art who have the benefit of the description of the disclosed concepts understand.

The low value of the test signal also causes MUX 75 to provide an inverted version of the input signal (IN), as supplied by inverter 70 at node 72, to inverter 30. Inverter 70 is a copy or replica of feed-forward inverter 30, used in delay cell 10, or it may be modified to have different drive strength (e.g., multiple copies of inverter 30 coupled in parallel). Referring to the exemplary embodiment shown in FIG. 5, note that inverter 71 (the feedback inverter) is shown with programmable drive strength. As the description above provides, the feed-forward inverter may also have programmable drive strength, as desired. Generally, one or both of the feed-forward and feedback inverters should have programmable or configurable or adjustable drive strength.

As discussed above, the exemplary embodiment in FIG. 5 shows multiple copies of inverter 71. In other exemplary embodiments, the opposite approach could be used as well, for example, inverter 71 may be identical to inverter 31, but inverter 70 may be a scaled down version of inverter 30 (one-fourth the drive strength, for example). Control circuit 80 forces the drive strengths of inverters 70 and 71 to be equal so that the drive strengths of inverters 30 and 31 will have a 4:1 ratio (or other desired ratio).

When the test signal has a logic low value, a signal with the same logic value (whether low or high, depending on the value of input signal (IN) appears at, and drives, node 72. Thus, no contention exists between the outputs of inverters 70 and 71.

Now consider the situation where the test signal has a logic high value. In this situation, the logic high signal applied to the select input of MUX 84 causes an inverted version of the input signal (IN) to be applied to the input of inverter 71. Thus, the output of inverter 71 provides a true version of the input signal (IN).

Furthermore, the true version of input signal (IN) is applied to the input of inverter 70. As a result, the output of inverter 70 provides an inverted version of the input signal (IN).

Because inverter 70 and inverter 71 provide at their respective outputs inverted and true versions of the input signal to node 72, a contention occurs at node 72. Put another way, the outputs of inverters 70 and 71 drive opposite logic values at node 72, similar to the situation created during switching in the delay cell.

The voltage at node 72 varies based on the relative strengths of the contentious paths through inverters 70 and 71 (either a pull-up path in inverter 70 and a pull-down path in inverter 71, or vice-versa). MUX 75 passes this contention voltage to node 73, which is the input to a copy of the feed-forward inverter 30. Note that inverter 30 in FIG. 5 may be the same or similar to inverter 30 in FIG. 1. In exemplary embodiments, inverter 30 is the same as the feed-forward inverters in the actual delay chains (the same switching threshold), given that it is used to determine whether the contention voltage at node 73 is above or below the switching threshold.

Inverter 31 in FIG. 5 may be a desired inverter, for example, inverter 31 in FIG. 1, a logic inverter, etc. Inverter 30 will interpret the contention voltage as logic high or logic low at node 74. Inverter 31 inverters the signal at node 74 and drives it back into MUX 75 to close the feedback loop between nodes 73 and 74 (essentially forming a latch).

If the contention voltage is below the switching threshold of inverter 30, a logic one is driven onto node 74. If the contention voltage is above the switching threshold of inverter 30, a logic zero is driven onto node 74. When the test signal is de-asserted, MUX 75 completes a feedback loop through inverters 30 and 31, so that the logic value at node 74 can be stored (via inverters 30 and 31).

Control circuit 80 compares input (IN) and the value at node 74 to determine if feed-forward inverter 70 is strong enough (i.e., whether it has enough drive strength) relative to inverter 71 to pass input signal (IN) through to nodes 72, 73 and 74. Output 77 (labeled "OUT") represents one or more control signals broadcast to delay cells, for example, the delay cells in FIG. 2.

Control circuit 80 generates control signals, which it provides to inverter 71 via bus or coupling mechanism 76. The control signals are used to modulate or tune the drive strength of inverter 71.

In some embodiments, the strength of pull-up and pull-down paths through 71 may be controlled independently using different sets of control signals. In some embodiments, the strength of pull-up and pull-down paths through 71 may be controlled uniformly (i.e., they track each other).

In some embodiments, the control signals may be adjusted or tuned based on a sampling event, as described above. The sampling event constitutes the falling edge of signal Test. In exemplary embodiments, sampling occurs when node 73 has settled to the contention voltage, and node 74 has settled to logic high or low. The falling edge of signal Test closes the feedback loop, so that the logic value at node 74 is held (as noted, inverters 30 and 31 form essentially a latch). As noted, control circuit 80 can then compare this value to the input signal (IN) to determine whether the input signal is able to propagate through the contention node.

If the signal values at input (IN) and node 74 are not the same, then inverter 70 is not strong enough, relative to inverter 71, to pass the input signal value through inverter 30 to node 74. In this case, control circuit 80 may adjust or tune the control signals on bus 76 so that the strength of inverter 71 is reduced.

Control circuit 80 may be realized or implemented in a variety of ways, as persons of ordinary skill in the art who have the benefit of the description of the disclosed concepts understand. In some embodiments, control circuit 80 may include an exclusive-OR (XOR) gate that compares the two inputs (i.e., the input signal at IN, and the output signal of inverter 30), and a counter (neither shown explicitly in FIG. 5).

If the two input signals to control circuit 80 are different, the output of the XOR gate may decrement a counter that generates one of the sets of output signals provided to bus 76. If the IN input is high, the pull-up control signal provided to inverter 71 (i.e., the signal that causes change of the drive strength of the pull-up path in inverter 71, for example, as shown in FIG. 3) may be decremented.

On the other hand, if the input signal (IN) is low, the pull-down control signal provided to inverter 71 (i.e., the signal that causes change of the drive strength of the pull-down path in inverter 71, for example, as shown in FIG. 3) may be decremented (by using the counter). If the values on IN and 74 are the same, then inverter 70 is strong enough, relative to inverter 71. The comparison circuitry may then increment the counter to increase the strength of 71.

Control circuit 80 may generate an alternate set of control outputs (on bus or coupling mechanism 77) that are supplied to one or more delay cells. These signals may control the drive strength(s) of the feedback inverter(s) in that (or those) delay cell(s).

The values of the signals on bus 77 may differ from those of the signals on bus 76. For example, the values on bus 76 may be the highest control setting for which inverter 70 is stronger than inverter 71. A reduced (lower value than the value on bus 76) control setting may be supplied via bus 77 so that the actual delay cells used in the circuit (i.e., delay cells calibrated by the circuitry shown in FIG. 5) have weaker feedback inverters.

In exemplary embodiments, circuit arrangement 69 is used for calibration. The circuit determines the optimal or desired control setting(s) and broadcasts the setting(s) to one or more delay cells (e.g., delay cell 10 in FIG. 1) used to delay actual clock, data, or other signals in a circuit or design (for example, an integrated circuit (IC) on the same substrate as the calibration circuit shown in FIG. 5). This scheme provides additional functionality margin in the actual delay cells to account for tracking error and mismatch in circuit arrangement 69 and the delay cells.

In some embodiments, the values on bus 77 may be a scaled version of the values provided via bus 76. In some embodiments, the values on bus 77 may have a fixed offset relative to the values on bus 76. For example, the values on bus 77 may be lower than those on bus 76 by one in order to maintain functionality even if bus 76 is temporarily incremented to a level that causes a functional failure.

Functional failure may occur if the drive strength of inverter 70 is not large enough, relative to that of inverter 71, for the logic value at the input (IN) to propagate through to node 74. This situation is acceptable in circuit arrangement 69, given that the condition informs control circuit 80 that the drive strength of inverter 71 should be reduced (or causes control circuit 80 to reduce the drive strength of inverter 71).

In an actual delay cell used in a circuit or design (other than the calibration circuit shown in circuit arrangement 69), however, if inverter 30 is not strong enough relative to inverter 31, an input transition will not propagate through the delay cell, and the logic value at the delay cell output would be incorrect. Circuit arrangement 69 provides the capability to calibrate the inverter(s) in the delay cell(s) as appropriate or desired to obtain specified or desired performance.

In some embodiments, other digital signal processing operations may be performed on the signals provided via bus 77 before they are broadcast to the controlled delay cells (via output "OUT"). For example, in one exemplary embodiment, the values on bus 76 may be low-pass filtered to remove high-frequency changes that may be caused by random noise in the tracking circuit, where the low-pass filtered version is broadcast on bus 77.

As persons of ordinary skill in the art who have the benefit of the description of the disclosed concepts understand, one may use the delay cells and associated circuitry according to the disclosed concepts effectively to implement various circuitry, blocks, and/or systems. For example, in some embodiments, one may use the disclosed delay cells (with or without adaptive tuning, as desired) in an IC in order to implement a delay locked loop (DLL) circuit.

Figure 6:
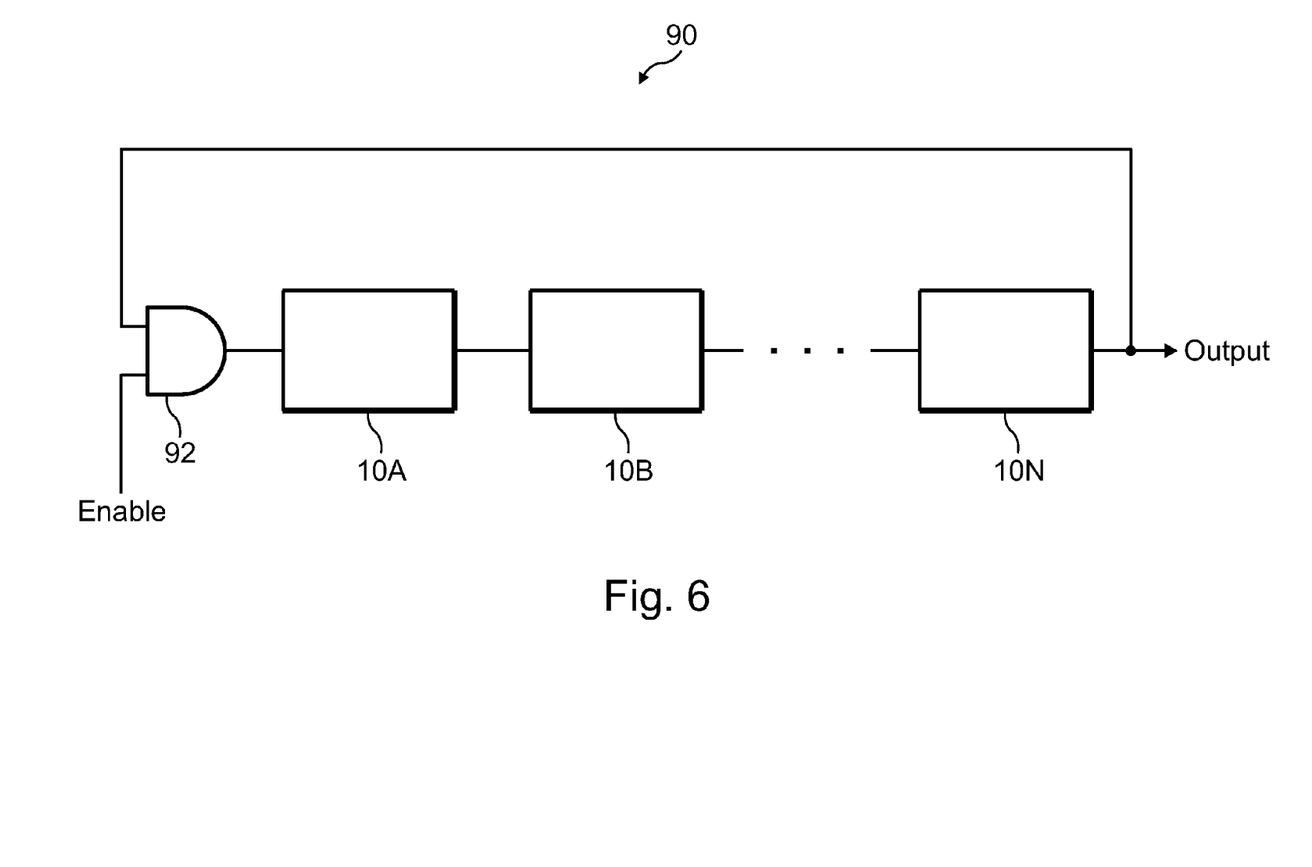
FIG. 6 shows a circuit arrangement for a delay locked loop (DLL) according to an exemplary embodiment.

DLL circuits are used in a variety of situations, for example, to generate clock signals or other reference signals, as persons of ordinary skill in the art understand. FIG. 6 shows a circuit arrangement 90 for a DLL according to an exemplary embodiment. Circuit arrangement 90 includes a plurality of delay cells 10A-10N, arranged in cascade fashion.

The output of delay cell 10N couples to the input of delay cell 10A via AND gate 92. An enable signal (ENABLE) allows AND gate 92 to control whether the input of delay cell 10A receives a logic low (i.e., no oscillation at the output of delay cell 10N) or the output signal of delay cell 10N (i.e., oscillation in the DLL).

Figure 7:
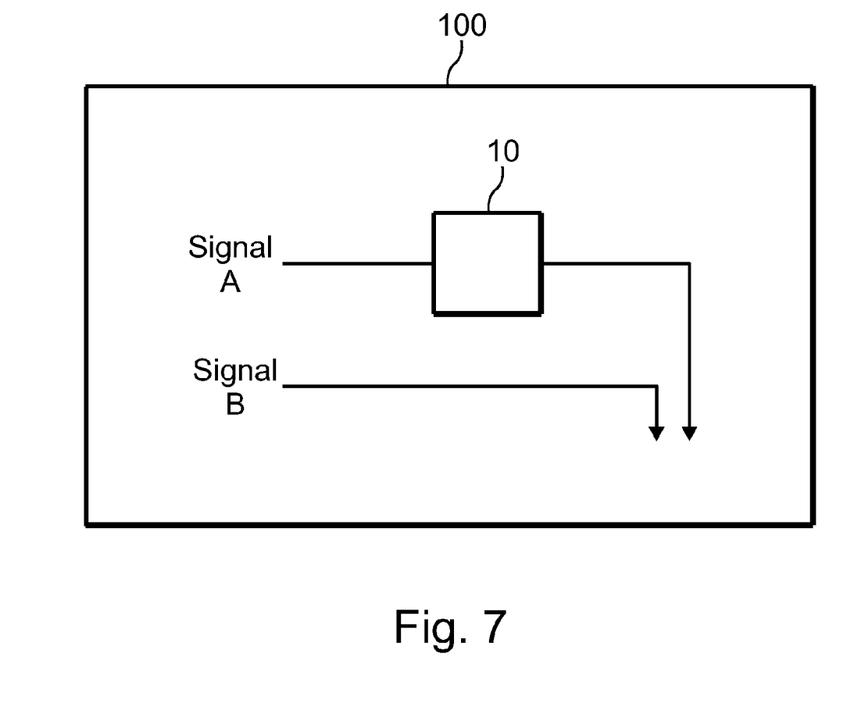
FIGS. 7-9 depict circuit arrangements for delaying one or more signals according to exemplary embodiments.

In some embodiments, one may use the disclosed delay cells (with or without adaptive tuning, as desired) to delay signals. For instance, as shown in FIG. 7, one may delay signal A in IC 100 relative to signal B in IC 100. Signals A and B may be provided to circuitry within or external to IC 100, as desired.

Figure 8:
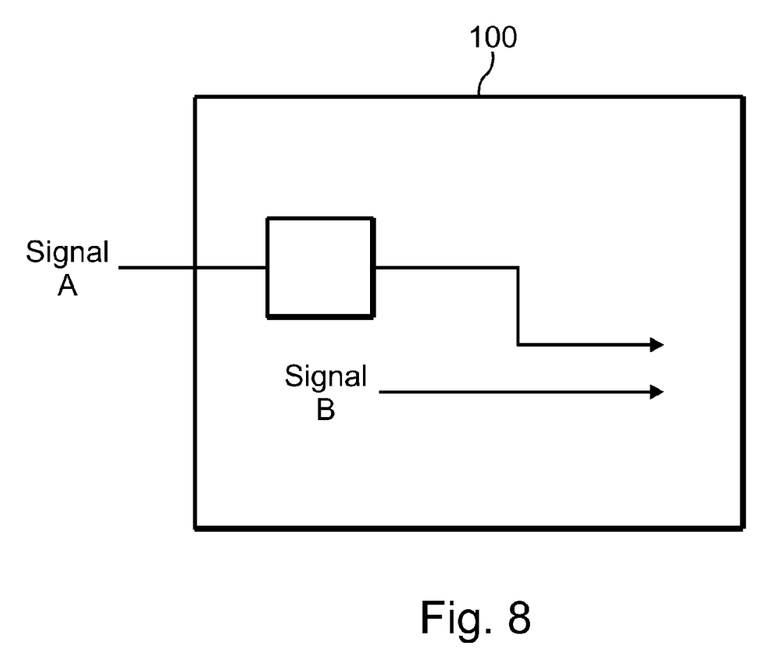

As another example, as shown in FIG. 8, one may delay a signal external to IC 100, signal A, relative to a signal internal to IC 100, i.e., signal B. Signals A and B may be provided to circuitry within or external to IC 100, as desired.

Figure 9:
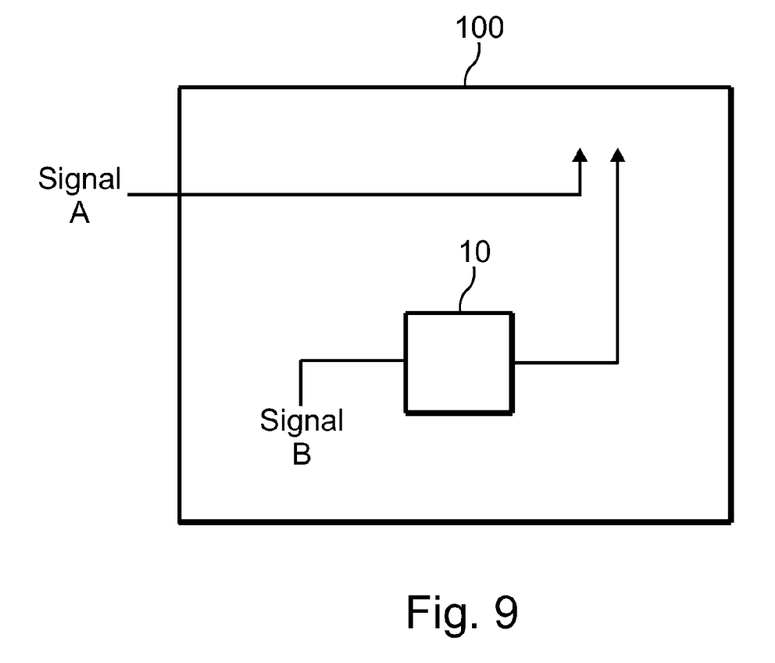

In yet another example, illustrated in FIG. 9, one may delay a signal internal to IC 100, i.e., signal B, relative to a signal external to IC 100, i.e., signal A. Signals A and B may be provided to circuitry within or external to IC 100, as desired.

As persons of ordinary skill in the art who have the benefit of the description of the disclosed concepts understand, other configurations are possible. For example, one may delay more than one signal in IC 100, by the same or different amounts of delay, as desired.

As another example, one may delay more than one signal external to IC 100, by the same or different amounts of delay, as desired. One may also combine such scenarios, for example, by delaying more than one internal signal and more than one external signal, by the same or different amounts of delay, as desired. Furthermore, in each of the situations described, one may use one or more delay cells in tandem, as desired.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A delay cell, comprising:
   a feed-forward inverter having an input and an output; and
   a feedback inverter, having an input and an output, coupled to the feed-forward inverter,
   wherein a drive strength of the feed-forward inverter is larger than a drive strength of the feedback inverter such that a transition at the input of the feed-forward inverter propagates to the output of the feed-forward inverter, and
   wherein respective sensitivities of the feed-forward and feedback inverters are selected such that a sensitivity of the delay cell has a desired value.

2. The delay cell according to claim 1, wherein the output of the feed-forward inverter is coupled to the input of the feedback inverter, and wherein the input of the feed-forward inverter is coupled to the output of the feedback inverter.

3. The delay cell according to claim 1, wherein respective sensitivities of the feed-forward and feedback inverters are selected such that the sensitivity of the feed-forward inverter offsets the sensitivity of the feedback inverter.

4. The delay cell according to claim 1, wherein the drive strength of at least one of the feed-forward inverter and the feedback inverter is adjusted by changing an effective width of a gate of a transistor in the respective inverter.

5. The delay cell according to claim 4, wherein the effective width of the gate of the transistor is changed in response to a control signal.

6. The delay cell according to claim 1, wherein the drive strength of at least one of the feed-forward and feedback inverters is adjusted by changing an effective length of a gate of a transistor in the respective inverter.

7. The delay cell according to claim 6, wherein the effective length of the gate of the transistor is changed in response to a control signal.

8. The delay cell according to claim 1, wherein the drive strength of at least one of the feed-forward inverter and the feedback inverter is adjusted adaptively.

9. The delay cell according to claim 8, wherein the drive strength of at least one of the feed-forward inverter and the feedback inverter is adjusted in response to a plurality of signals supplied by a control circuit.

10. The delay cell according to claim 1, wherein the sensitivity of at least one of the feed-forward and feedback inverters is adjusted by changing a threshold voltage of a transistor in the respective inverter.

11. The delay cell according to claim 1, wherein an input signal to the delay cell comprises a signal in an integrated circuit (IC).

12. The delay cell according to claim 1, wherein an input signal to the delay cell comprises a signal external to an integrated circuit (IC).

13. A delay chain circuit, comprising a plurality of delay cells coupled in cascade, each delay cell having a feed-forward path and a feedback path, wherein a drive strength of the feed-forward path is larger than a drive strength of the feedback path such that a transition at an input of the respective delay cell propagates to an output of the delay cell, and wherein the drive strength of a feed-forward path and/or a feedback path in at least one delay cell is adjusted so that a delay of the delay chain is supply voltage insensitive.

14. The delay chain circuit according to claim 13, coupled to form a delay locked loop (DLL).

15. The delay chain circuit according to claim 13, wherein a sensitivity of at least one delay cell is adjusted so that a delay of the delay chain is supply voltage insensitive.

16. A method of delaying a signal by a desired delay, the method comprising:
    feeding the signal to an input of a feed-forward path to generate an output signal; and
    feeding back the output signal through a feedback path to the input of the feed-forward path,
    wherein drive strengths and/or sensitivities of the feed-forward and feedback paths are adjusted such that the delay has a desired sensitivity to a quantity.

17. The method according to claim 16, wherein the quantity comprises a supply voltage.

18. The method according to claim 16, wherein the quantity comprises a process variable.

\* \* \* \* \*